United States Patent
Yin

(10) Patent No.: US 6,801,068 B2
(45) Date of Patent: Oct. 5, 2004

(54) DELAY CLOCK PULSE-WIDTH ADJUSTING CIRCUIT FOR INTERMEDIATE FREQUENCY OR HIGH FREQUENCY

(75) Inventor: Dengqing Yin, Beijing (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 10/278,888

(22) Filed: Oct. 24, 2002

(65) Prior Publication Data

US 2003/0112044 A1 Jun. 19, 2003

Related U.S. Application Data

(63) Continuation of application No. PCT/CN01/00563, filed on Apr. 19, 2001.

(30) Foreign Application Priority Data

Apr. 24, 2000 (CN) ............................................ 00105996
Apr. 24, 2000 (CN) ............................................ 00105997

(51) Int. Cl.$^7$ ............................................ H03K 3/017
(52) U.S. Cl. ...................................... 327/172; 327/170
(58) Field of Search ................................ 327/170, 172, 327/173, 174, 176, 262, 263, 264, 266, 330

(56) References Cited

U.S. PATENT DOCUMENTS

| 5,077,652 | A | * | 12/1991 | Faley ........................... 363/97 |
| 5,115,205 | A | * | 5/1992 | Holmes, Jr. ................... 330/10 |
| 5,568,078 | A | | 10/1996 | Lee .............................. 327/262 |
| 5,574,707 | A | | 11/1996 | Hirai ........................ 369/47.31 |
| 5,914,622 | A | | 6/1999 | Inoue .......................... 327/172 |
| 6,084,451 | A | * | 7/2000 | Choi et al. ................... 327/172 |

FOREIGN PATENT DOCUMENTS

EP        0 526227 A2    3/1993

* cited by examiner

Primary Examiner—Linh M. Nguyen
(74) Attorney, Agent, or Firm—Bacon & Thomas, PLLC

(57) ABSTRACT

The invention discloses a delay clock pulse-width adjusting circuit. The circuit comprises: a power supply; a delay comparator, which one input terminal inputs a sine wave signal and another input terminal inputs a compare voltage, which output terminal outputs a clock signal with a defined duty-ratio; and a converting circuit, converting the clock signal to a DC level, which input terminal is connected to the output terminal of the delay comparator, which output terminal is connected to the another input terminal of the delay comparator. With the circuit, the duty-ratio of a clock signal is no longer abrupt change, so burden of the digital signal processing is decreased. Consequently, the adjusting circuit satisfies requirements: high traffic, low error rate and high stability of the clock signal duty-ratio.

30 Claims, 10 Drawing Sheets

DELAY CLOCK PULSE-WIDTH ADJUSTING CIRCUIT FOR INTERMEDIATE FREQUENCY OR HIGH FREQUENCY

This application is a continuation of International Application PCT/CN01/00563, filed 19 Apr. 2001, of which the entire disclosure of the pending, prior application is hereby incorporated by reference.

FIELD OF THE TECHNOLOGY

The present invention relates generally to a delay clock pulse-width adjusting circuit, and more particularly to a delay clock pulse-width adjusting circuit which is consisted of a delay comparator and a converting circuit, which converts the duty-ratio of a clock signal to a DC level.

BACKGROUND OF THE INVENTION

In a modern signal processing system, a clock signal is indispensable. Along with the rapid development of some technical fields such as the communication, the requirement of a clock signal is getting higher. The main requirements are shown in the followings:

(1) The high frequency accuracy of a clock signal, which is solved by using a crystal oscillator or atomic clock;

(2) The long time stability of a clock signal, it is required that for one year or even longer there is only one second error or lower than one second error of a clock signal; this is solved by the clock source stability;

(3) The duty-ratio stability of a clock signal, the larger duty-ratio deviation of a clock signal can cause a larger error rate in a communication system. In an A/D converter, a sample rate in a sample/hold circuit is defined at design stage. If the duty-ratio of a clock signal changes, charging time for some capacitors will be decreased, so converting accuracy will be lower than the requirement.

FIG. 1 is a schematic diagram of a present clock generator. As shown in FIG. 1, a duty-ratio change of the clock signal mainly comes from two aspects: a system error and a random error. The system error includes a voltage amplitude change of the crystal oscillator output, a harmonics produced by loads of the clock, a change of the DC trigger level and the temperature drift etc. The random error mainly comes from the followings: a DC component deviation of the sine wave output of a crystal oscillator, a random deviation in the comparator input grade and a deviation of the DC triggering level etc.

To simplify the analysis process, all the errors are converted to a sine output of the crystal oscillator. Also, suppose a signal deviation is smaller; i.e. when analyzing error influence on a duty-ratio, according to the sine wave equation, change of a trigger time is:

$$\Delta V = V \sin(2\pi f \times \Delta t) \quad (1)$$

Wherein V is amplitude of the sine wave, f is a frequency and $\Delta V$ is a DC component change of the sine wave. Suppose $V \gg \Delta V$, according to the approximate equation of a sine function, from formula (1) the change of a trigger time can be approximately expressed by:

$$\Delta t = \Delta V/V \times 2\pi f \quad (2)$$

Since trigger time is same for leading triggering edge and falling triggering edge, so according to formula (2) change of the duty-ratio can be expressed as:

$$\Delta D = \Delta V/nV \quad (3)$$

From formula (3), the signal, shown in FIG. 2, can be obtained.

It is seen from FIG. 2 that for the ideal clock signal if duty=t2/(t1+t2), then the signal DC level is consistent with the DC component of the sine wave. For the real clock signal, the DC trigger level is not consistent with the DC component of the sine wave, as shown by real line and dot line in FIG. 2 respectively. In FIG. 2, DC component change of the sine wave outputted by the crystal oscillator is a negative polarity, but in real, changing polarity can be positive or negative.

SUMMARY OF THE INVENTION

The purpose of the invention is to provide a delay clock pulse-width adjusting circuit which can be used in a clock signal circuit for intermediate frequency or high frequency. With this adjusting circuit, the duty-ratio of a clock signal is no larger abrupt change, so burden of the digital signal processing is decreased. The adjusting circuit also is suitable for submicron integrated circuit technology, so it will decrease influence of the random error during chips manufacturing process. Consequently, the adjusting circuit makes chips of digital-analog hybrid integrated circuit satisfy the requirement: high traffic, low error rate and high stability of the clock signal duty-ratio.

For the purpose mentioned above, the invention first provides a delay clock pulse-width adjusting circuit for intermediate frequency or high frequency with a delay comparator and a power supply. It is important that the adjusting circuit also includes:

One input terminal of the delay comparator inputs a sine wave signal which compares with a voltage inputted from another input terminal of the delay comparator, and the output is a defined duty-ratio clock signal; and A converting circuit converts a clock signal duty-ratio to a DC level. Input terminal of the converting circuit is connected to output terminal of the said delay comparator, and output of the converting circuit is a DC level which is converted from the said clock signal. Again, output terminal of the converting circuit is connected to another input terminal of the said delay comparator.

Said converting circuit is mainly consisted of a Pulse-Width Modulation (PWM) filter module, which converts a clock signal to a DC level.

Said converting circuit is mainly consisted of a pulse-width modulator (PWM) filter module and a low pass filter circuit. The PWM filter module converts a clock signal to a DC level. The low pass filter circuit filters the DC level outputted from the PWM filter module then outputs to the delay comparator as an input.

Said low pass filter is a transconductance operational amplifier.

Said PWM filter comprises an inverter, whose input is a clock signal and output is an inverted clock signal; first switch, which is controlled by the inverted clock signal; second switch, which is controlled by the clock signal; first current source, which is connected to the supply with one end and to the first switch with another end; second current source, which is connected to the ground with one end and is connected to a node A with another end; third current source, which is connected to the ground with one end and to the second switch with another end; first current mirror, which is connected to the second switch with one end and is connected to the supply with another end; second current mirror, which is connected to the supply with one end and to the output with another end, and a current to voltage converter, which is connected to the ground with one end and to the output with another end.

Said first switch is an OR gate consisted of a pair of PMOS transistors, and said second switch is an OR gate consisted of a pair of NMOS transistors. Said a current mirror is consisted of two MOS transistors with the connections as follow: the drain and gate of one MOS transistor is connected with the gate of another MOS transistor, the sources of the two MOS transistors are connected with the supply, and the drain of another MOS transistor is the output. Said current to voltage converter is a capacitor.

Said converting circuit at least includes:

A detection circuit is used to detect whether the input clock signal, which is the output of said delay comparator, exists a floating signal and to output a voltage difference according to the floating signal; and A correction circuit is used to correct the threshold voltage input of said delay comparator according to the voltage difference output of the detection circuit.

Said detection circuit has an inverter, which inverts an input clock signal to output an inverted clock signal; a current switch, which is controlled by the clock signal and inverted clock signal; first current mirror circuit, which is connected with one input of the current switch and charges the capacitor of the correction circuit when the clock signal is a high level; second current mirror circuit, which is connected to another input of the current switch; and third current mirror circuit, which is connected with second current mirror circuit and discharges the capacitor of the correction circuit when the clock signal is a low level.

Said detection circuit also has a current source circuit used to provide a bias current to the current switch.

There is another detection circuit. The detection circuit at least includes an inverter, which inverts the input clock signal and outputs an inverted clock signal; first and second current switches, which are serially connected with each other and are controlled by the clock signal and the inverted clock signal; first current source circuit, which is connected to the supply with one end and to the first current switch with another end, and charges the capacitor of the correction circuit when the clock signal is a high level; and second current source circuit, which is connected to the second current switch with one end and to the ground with another end, and discharges the capacitor of the correction circuit when the clock signal is a low level.

Said current switch is an OR gate of two MOS transistors. Said current mirror circuit is connected as follow: the drain and gate of one MOS transistor are connected with the gate of another MOS transistor, the sources of the two MOS transistors are connected with the supply, and the drain of another MOS transistor is the output.

The correction circuit is consisted of a current to voltage converting circuit and a comparative circuit. The said correction circuit is a current source circuit consisted of an operational amplifier, a NMOS transistor and a resistance. The said current to voltage circuit is consisted of a MOS transistor and a capacitor.

The invention also provides two schemes for long delay processing.

A long delay clock pulse-width adjusting circuit for intermediate or high frequency has a delay comparator and more than one kind of power supplies. The adjusting circuit includes:

One input of the said delay comparator is connected with a sine wave and compared with another input connected with a DC level, and the output of the said delay comparator is a clock signal with a defined duty-ratio;

A PWM filter module converts a clock signal to a DC level, whose input is connected to the delay comparator output, and whose output is connected to the another input of the delay comparator.

Said PWM filter module has an inverter, which inverts an input clock signal to output an inverted clock signal; first switch, which is controlled by the inverted clock signal; second switch, which is controlled by the clock signal; first current source, which is connected to the supply with one end and to the first switch with another end; second current source, which is connected to the ground with one end and to a node A with another end; third current source, which is connected to the ground with one end and to the second switch with another end; first current mirror, which is connected to the second switch with one end and to the supply with another end; second current mirror, which is connected to the supply with one end and to the output with another end; and a current to voltage converter, which is connected to the ground with one end and to the output with another end.

Said first switch is an OR gate consisted of a pair of PMOS transistors, and said second switch is an OR gate consisted of a pair of NMOS transistors. A said current mirror is connected as follow: the drain and gate of one MOS transistor are connected with the gate of another MOS transistor, the sources of two MOS transistors are connected with the supply and the drain of another MOS transistor is an output. Said a current to voltage converter is a capacitor.

A long delay clock pulse-width adjusting circuit for intermediate or high frequency has a delay comparator and more than one kind of power supplies. The adjusting circuit includes:

One input of the said delay comparator is connected with a sine wave and compared with another input connected with a DC level, and the output of the said delay comparator is a clock signal with a defined duty-ratio;

A PWM filter module converts a clock signal to a DC level, whose input is connected to the delay comparator output; and A low pass filter circuit filters the output DC level of said PWM filter module and the output of the filter is used as the input DC level of said delay comparator.

Said low pass filter circuit is a transconductance operational amplifier.

Said PWM filter module has an inverter, whose input is a clock signal and output is an inverted clock signal; first switch, which is controlled by the inverted clock signal; second switch, which is controlled by the clock signal; first current source, is connected to the supply which with one end and to the first switch with another end; second current source, which is connected to the ground with one end and to a node A with another end; third current source, which is connected to the ground with one end and to the second switch with another end; first current mirror, which is connected to the second switch with one end and to the supply with another end; second current mirror, which is connected to the supply with one end and to the output with another end; and a current to voltage converter, which is connected to the ground with one end and to the output with another end.

Said first switch is an OR gate consisted of a pair of PMOS transistors, and said second switch is an OR gate consisted of a pair of NMOS transistors. A said current mirror is connected as follow: the drain and gate of one MOS transistor are connected with the gate of another MOS transistor, the sources of two MOS transistors are connected with the supply and the drain of another MOS transistor is an output. Said a current to voltage converter is a capacitor.

The invention also provides a short delay clock pulse-width adjusting circuit for intermediate or high frequency, which has a delay comparator and a power supply. The adjusting circuit includes:

One input of the said delay comparator is connected with a sine wave and compared with another input connected with a threshold voltage, and the output of the said delay comparator is a clock signal with a defined duty-ratio;

A detection circuit is used to detect whether the input clock signal, which is the output of said delay comparator, exists a floating signal and to output a voltage difference according to the floating signal; and A correction circuit is used to correct the clock signal according to the voltage difference output of the detection circuit, which output terminal is connected to the another input terminal of the delay comparator.

Said detection circuit has an inverter, which inverts an input clock signal and outputs an inverted clock signal; a current switch, which is controlled by the clock signal and inverted clock signal; first current mirror circuit, which is connected to one input of the current switch and charges the capacitor of the correction circuit when the clock signal is a high level; second current mirror circuit, which is connected to another input of the current switch; and third current mirror circuit, which is connected to the second current mirror circuit and discharges the capacitor of the correction circuit when the clock signal is a low level.

Said detection circuit also has a current source circuit used to provide a bias current to the current switch.

There is another detection circuit. The detection circuit at least includes an inverter, which inverts the input clock signal to output an inverted clock signal; first and second current switches, which are serially connected with each other and are controlled by the clock signal and the inverted clock signal; first current source circuit, which is connected to the supply with one end and to the first current switch with another end, and charges the capacitor of the correction circuit when the clock signal is a high level; and second current source circuit, which is connected to the second current switch with one end and to the ground with another end, and discharges the capacitor of the correction circuit when the clock signal is a low level.

Said current switch is an OR gate of two MOS transistors. Said current mirror circuit is connected as follow: the drain and gate of one MOS transistor are connected with the gate of another MOS transistor, the sources of the two MOS transistors are connected with the supply, and the drain of another MOS transistor is the output.

The correction circuit is consisted of a current to voltage converting circuit and a comparative circuit. The said correction circuit is a current source circuit consisted of an operational amplifier, a NMOS transistor and a resistance. The said current to voltage converting circuit is consisted of a MOS transistor and a capacitor.

The invention can deal with pulse-width adjustment of a long delay clock signal with lower than 200 MHz frequency. Through filtering the pulse-width modulation signal, a DC level, which is proportional to the duty-ratio of a clock signal, can be obtained. In general, the clock signal has higher frequency, such as higher than 10 MHz, so the invention has designed a filter for this requirement.

The invention, a delay clock pulse-width adjusting circuit for intermediate or high frequency, takes a sine wave through a delay comparator to produce a clock signal. The output of the delay comparator is a clock signal, whose duty-ratio can be slowly changed, and whose output, which is used as a pulse-width modulation signal, is inputted to a converting circuit. The output of the converting circuit, which is used as a DC comparative level, is inputted to the delay comparator. Therefore, the DC comparative level of the delay comparator is floating; but in the present circuit, the DC comparative level is fixed.

During working period of the adjusting circuit, the DC level of the delay comparator will follow the DC component of a sine wave, which changes slowly. The output duty-ratio of the delay comparator will slowly approach to a preset value until the DC comparative level of the delay comparator has completely compensated the DC component of the sine wave, which has abruptly changed. The duty-ratio of the clock signal will recover to the preset value. The duration can be several tens to several hundreds clock cycles, which depends on a specific situation.

Consequently, the adjusting circuit of the invention can solve the duty-ratio of a clock signal slowly changing problem. The duty-ratio changing is a system error and a random error, which are caused by such as devices dismatch during manufacturing, strength uneven distribution during packing, temperature changing and low frequency noise, etc.

Although, in the above description, the DC component of a sine wave is abruptly changed, but the description is also suitable for a gradually changing situation.

The adjusting circuit of the invention can also deal with a short delay clock signal under 400 MHz. In this case, the duty-ratio of a clock signal is set to a defined value. Any change, deviating the defined value no matter it is an abrupt change or a gradual change, will be detected and corrected immediately. The correction duration is one to two clock cycles.

The detected circuit of duty-ratio, uses two kind of structures to solve a bottleneck problem of the integrate circuit response speed. Within one of which, correcting is made by using equity constant-current source method.

In the short delay processing circuit of the invention, the output clock signal is directly used in the detection circuit, so the devices dismatch influence caused by integrated circuit manufacturing is eliminated.

Although the duty-ratio adjusting circuit of a clock signal is designed for the quick response of a abrupt changing, but it also can be used in a gradually changing situation.

In summary, the invention, a delay clock pulse-width adjusting circuit for intermediate or high frequency, can deal with a long delay or short delay clock signal. The output of the adjusting circuit is a clock signal with stable duty-ratio, and the design of the adjusting circuit is suitable for sub-micron integrated circuit technology. Consequently, the adjusting circuit makes system of digital-analog hybrid satisfy the requirement: high traffic, low error rate and high stability of the clock signal duty-ratio.

EMBODIMENTS OF THE INVENTION

The invention will be described in more detail, hereinafter, with reference to drawings and embodiments.

Figure 3:
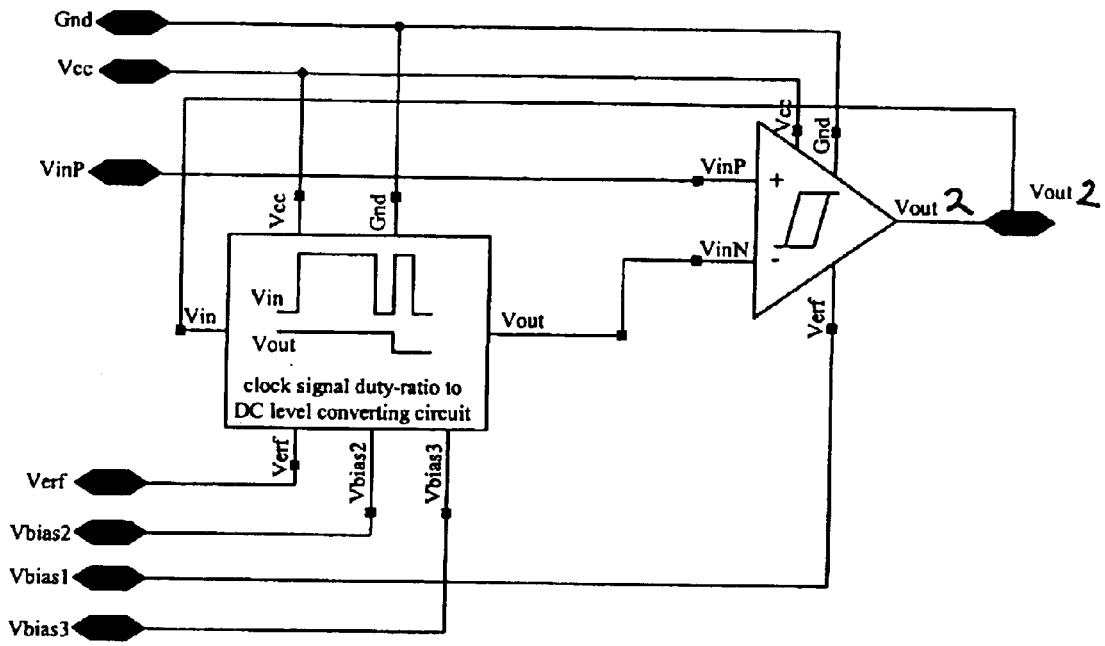
FIG. 3 is a block diagram of a delay clock pulse-width adjusting circuit.

FIG. 3 is a block diagram of the invention, a duty-ratio adjusting circuit of a clock signal. The adjusting circuit is consisted of a delay comparator module and a converting circuit, which converts a clock signal duty-ratio to a DC voltage level Vout.

In FIG. 3, Vcc and Gnd are the power supply and the ground, respectively. VinP is the sine wave input from an oscillator. Vout is the clock signal output of the converting circuit. Vref is a reference voltage. Vbias1, Vbias2 and Vbias3 are three bias voltage inputs. The supply Vcc and the ground Gnd are connected with the power supply terminals and the ground terminals of the delay comparator and the converting circuit, respectively. The bias voltage Vbias1 is connected with the reference voltage input terminal Vref of the delay comparator. The reference voltage Vref, bias voltages Vbias2 and Vbias3 are connected with corresponding terminals of the converting circuit. The sine wave outputted from an oscillator is connected to the P terminal of the delay comparator. The output terminal of the converting circuit is connected to the N terminal of the delay comparator, and the output terminal of the delay comparator is connected to the input terminal of the converting circuit. The voltage output by the delay comparator is indicated by Vout2.

The sine wave outputted from an oscillator is connected to the input terminal P of the delay comparator. When the input voltage of input terminal P is greater than the input voltage of the input terminal N, the output of the delay comparator is 1; otherwise, the output of the delay comparator is 0. Since the output of clock signal is connected to the input of the converting circuit and the output of the converting circuit is connected to the input terminal N of the delay comparator, the circuit is adaptive.

When the output is stable, output of the converting circuit is a setting value and the duty-ratio is within the defined scope. When for some reasons, the duty-ratio of the delay comparator output is increased; output of the converting circuit is also increased. Therefore, the threshold voltage of the delay comparator is changed and the clock signal duty-ratio in the delay comparator output terminal also is changed. Taking the duty-ratio increase of a short delay clock adjusting circuit as an example, reference to FIG. 15, when the duty-ratio of the delay comparator output is increased, output of the detective circuit will be increased. Consequently, the duty-ratio of clock signal will be decreased.

Figure 4:
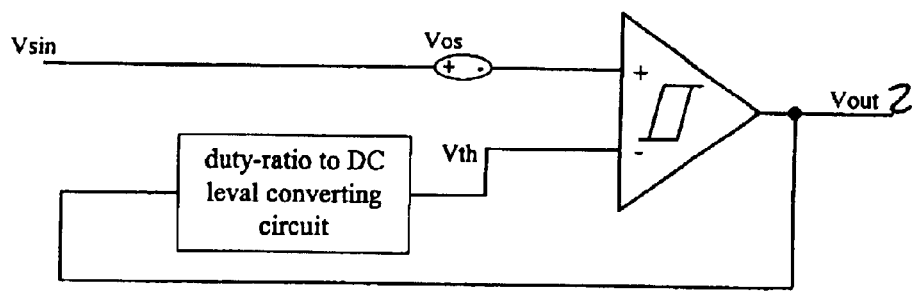
FIG. 4 is an immunity diagram from a level deviation for the adjusting circuit of the invention.

The adjusting circuit is further simplified as shown in FIG. 4, which is used to describe the circuit immunity function for DC voltage deviation caused by device dismatch etc.

In FIG. 4, all circuits are considered that they are no any voltage deviation. All possible voltage deviations are represented by the Vos. Vsin is sine wave input with DC component. Vth is the threshold voltage of the delay comparator, and is the output of the pulse duty-ratio converting circuit. Input of the circuit is the clock signal after shaping.

When Vos is positive, a signal at the delay comparator input terminal moves up. This leads that duty-ratios of a clock signal increases. The increased duty-ratio clock signal is inputted to the converting circuit, so the Vth is raised. When the circuit is in a stable working state, the raised value of Vth counteracts the Vos. Therefore, the system can adapt a random error caused by manufacturing in the circuit, and is immunity for a level deviation. Suppose the transfer function of the converting circuit, in which a duty-ratio of a clock signal is converted to a DC level, is:

$$H(D)=Vdc+K\times\Delta V$$

Wherein Vdc is a DC component, K is a converting circuit gain.
Suppose a duty-ratio transfer function of the delay comparator is:

$$\Delta\text{duty}=F(V)\times\Delta V$$

In the above formula, suppose that the duty-ratio response of a delay comparator is linearity, and F(V) is a duty-ratio coefficient when the level is a constant.

The duty-ratio change, caused by a voltage deviation, is:

$$\Delta\text{duty}=F(V)\times Vos$$

The delay comparator threshold voltage change, caused by a voltage deviation, is:

$$Vth=Vdc+KX\Delta\text{duty}=Vdc+K\times F(V)\times Vos \quad (4)$$

When the DC component in formula (s) is cancelled and only response to a voltage deviation is considered, then there will be four situations:

1. K×F(V)=1, the duty-ratio change, caused by a voltage deviation, is cancelled;
2. K×F(V)<1, the duty-ratio change, caused by a voltage deviation, is decreased;
3. 1<K×F(V)<2, not only the duty-ratio change is decreased, but also the change polarity is opposed;
4. K×F(V)>2, not only the duty-ratio change is increased, but also the change polarity is opposed.

It is seen that the invention adjusting circuit can cancel or decrease the duty-ratio change caused by a voltage deviation.

For a long delay clock pulse-width adjusting circuit, in general, there are two implementations, which are described in detail in the following embodiments 1 and 2.

Embodiment 1

Figure 5:
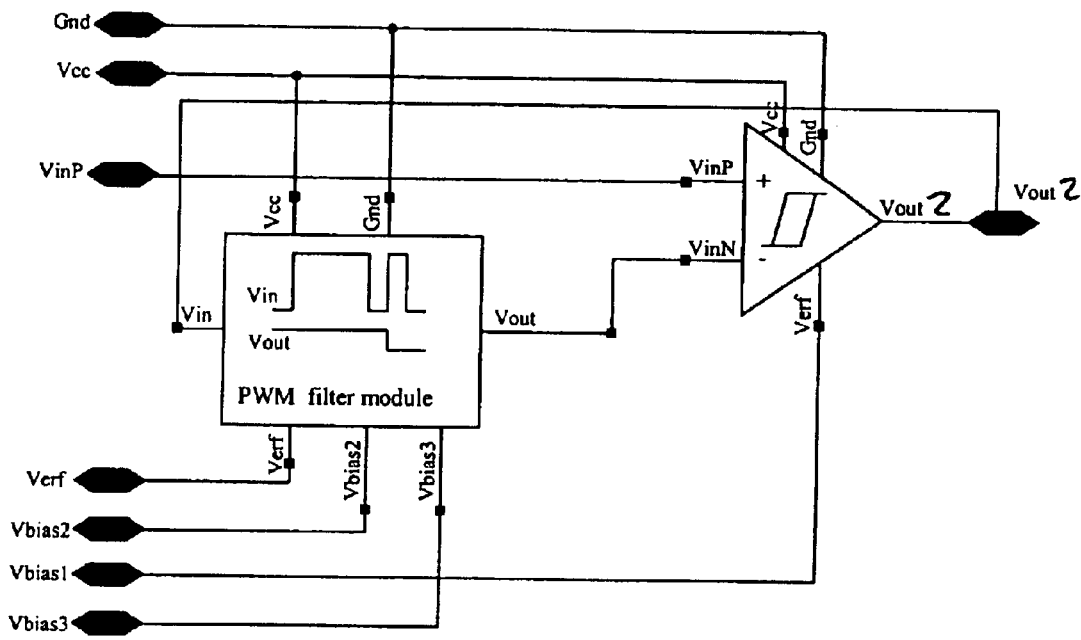
FIG. 5 is an adjusting circuit block diagram of a clock signal duty-ratio for the first embodiment of the invention.

FIG. 5 is a duty-ratio adjusting circuit of clock signal for embodiment 1. The adjusting circuit is consisted of a delay comparator module and a PWM filter module. Vcc and Gnd are the power supply and the ground, respectively. VinP is the sine wave input from oscillator. Vout is the clock signal output. Vref is a reference voltage. Vbias1, Vbias2 and Vbias3 are three bias voltage inputs. The power supply Vcc and ground Gnd are connected with the power supply terminal and the ground terminal of the delay comparator and the PWM filter module, respectively. The bias voltage Vbias1 is connected with the reference voltage input terminal Vref of the delay comparator. The reference voltage Vref, bias voltages Vbias2 and Vbias3 are connected with corresponding terminals of the PWM filter module. The sine wave outputted from an oscillator is connected to the P terminal of the delay comparator. The output terminal of the PWM filter module is connected to the N terminal of the delay comparator, and the output terminal of the delay comparator is connected to the input terminal of the PWM filter module.

The adjusting circuit works as follow. When the input voltage of input terminal P is greater than the input voltage of the input terminal N, the output of the delay. comparator is 1; otherwise, the output of the delay comparator is 0.

When the delay comparator output is stable, the output of the PWM filter module is a setting value and the duty-ratio of the clock signal is within the defined scope. When for some reasons, the duty-rato of the delay comparator output is increased, the output of the PWM filter module is also increased gradually. Therefore, the threshold voltage of the delay comparator is changed and the duty-ratio of the clock signal in the delay comparator output terminal is also changed.

In this embodiment, output of the PWM filter module also can be connected with a large capacitor (larger than nF level). The large outer connection capacitor can decrease clock signal vibration and improve system performance. The adjusting circuit is fabricated by the unipolar field-effect transistor technology and may be fabricated by bipolar transistor technology. When the adjusting circuit is fabricated by bipolar transistor technology, as bipolar transistor can control smaller current, such as nA level current, a capacitor about 10 pF can be used for filtering.

Embodiment 2

Figure 6:
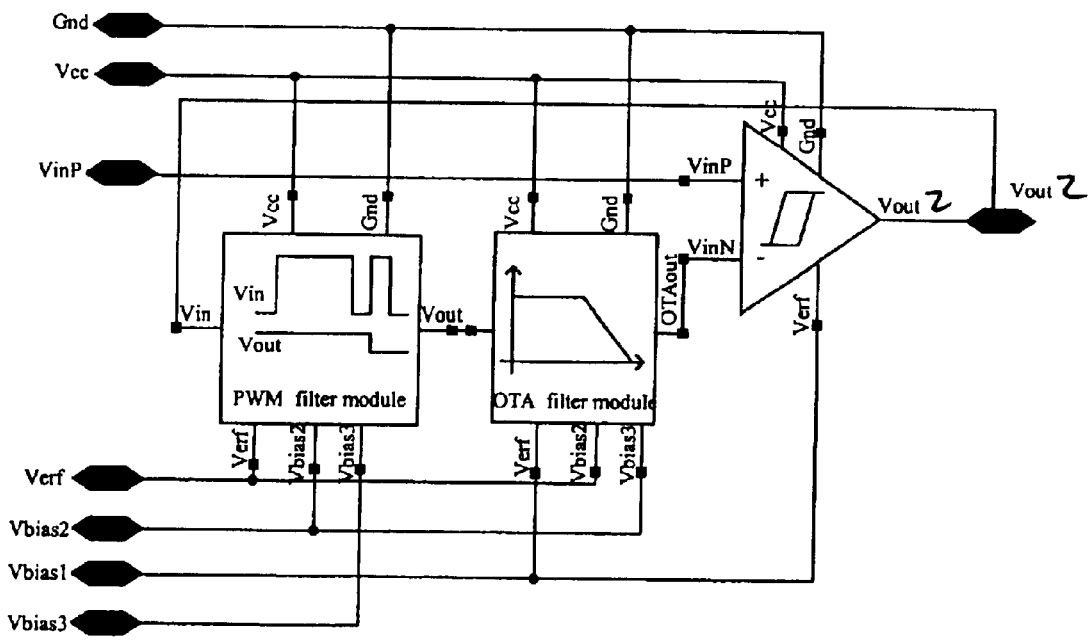
FIG. 6 is an adjusting circuit block diagram of a clock signal duty-ratio for the second embodiment of the invention.

FIG. 6 is a duty-ratio adjusting circuit of a clock signal for embodiment 2. The adjusting circuit is consisted of a delay comparator module, a PWM filter module and an Operational Transconductance Amplifier (OTA). The delay comparator is a product. The OTA module has higher output impedance, so it is easier to form a low pass filter with low cut-off frequency, which can improve a duty-ratio vibration caused by a floating threshold voltage of the delay comparator.

In FIG. 6, Vcc and Gnd are the power supply and the ground, respectively. VinP is the sine wave input from oscillator. Vout is the clock signal output. Vref is a reference voltage. Vbias1, Vbias2 and Vbias3 are three bias voltage inputs. Connections between modules of the adjusting circuit are similar to the embodiments circuit except that the power supply and the ground of the OTA are connected with Vcc and Gnd, respectively, Vref, Vbiasl, Vbias2 of the OTA are connected with corresponding voltage, respectively, and the output terminal of the PWM filter module is connected to the input terminal of the OTA module, and the output terminal of the OTA module is connected to N terminal of the delay comparator.

Working principle of the adjusting circuit is also similar to embodiment 1. When the input voltage of input terminal P is greater than the input voltage of the input terminal N, the output of the delay comparator is 1; otherwise, the output of the delay comparator is 0.

Sine the circuit applies an enhanced filter system, so an integrated internal filter can be used for the MOS transistor with smaller control current. Therefore, the adjusting circuit can be applied in a digital CMOS technology.

Figure 7:
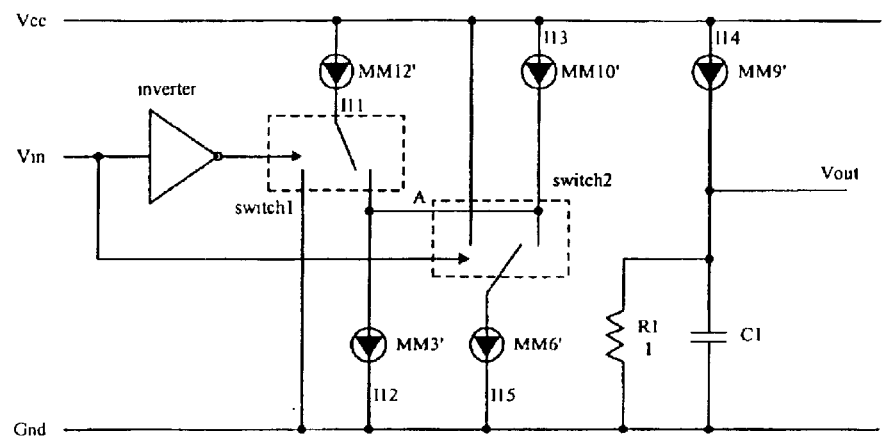
FIG. 7 is a converting circuit block diagram which converts the duty-ratio of a clock signal to a DC level in a long delay adjusting circuit.

FIG. 7 is diagram of a converting circuit, in which duty-ratio of a clock signal is converted to a DC level. In FIG. 7, MM12', MM3' and MM6', which are the first, second and third current source circuit, provide currents I11, I12 and I15, respectively. Transistors MM 10' and MM9' constitute a current mirror circuit with currents I13 and I14, which are the first and second current mirror circuit, respectively. Clock signal Vin is inputted to the input terminal of the inverter. The output of the inverter is an inverted clock signal, which is a control signal of the current switch 1, i.e. the first switch. Clock signal Vin is a control signal of the current switch 2, i.e. the second switch. Vcc and Gnd are the power supply and the ground, respectively. One end of the current source I11 is connected to Vcc, while another end is connected to the current switch 1. One end of the current source I12 is connected to the ground Gnd, while another end is connected to the node A. One end of the current source I15 is connected to the ground Gnd, while another end is connected to the switch 2. One end of the current mirror I13 is connected to the switch 2, while another end is connected to Vcc. One end of the current mirror I14 is connected to Vcc, while another end is connected to the output. One end of the resistance R11 and capacitor CI is connected to Gnd, while another end is connected to the output. Vout is the output of the converting circuit, which can be used as either an input of a low pass filter (reference to embodiment 2) or a DC level for a comparator (reference to embodiment 1).

When control signal of the switch 1 is 1, the current source I11 is connected to node A, otherwise is shorted to the ground. When control signal of the switch 2 is 1, the current source I15 is connected to node A, otherwise is shorted to the supply Vcc.

The current source I12, which is connected to node A, is a bias current of current mirrors I13 and I14.

Figure 1:
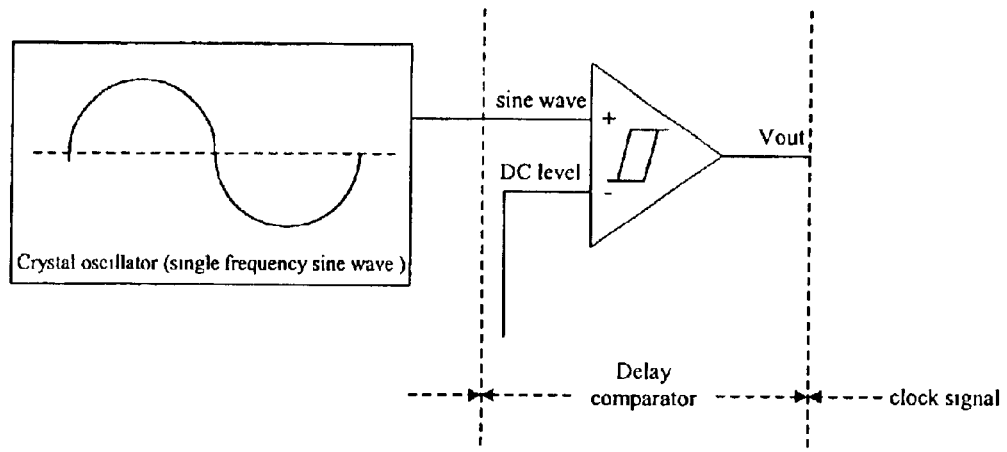
FIG. 1 is a principle diagram of a clock signal generator.
Figure 2:
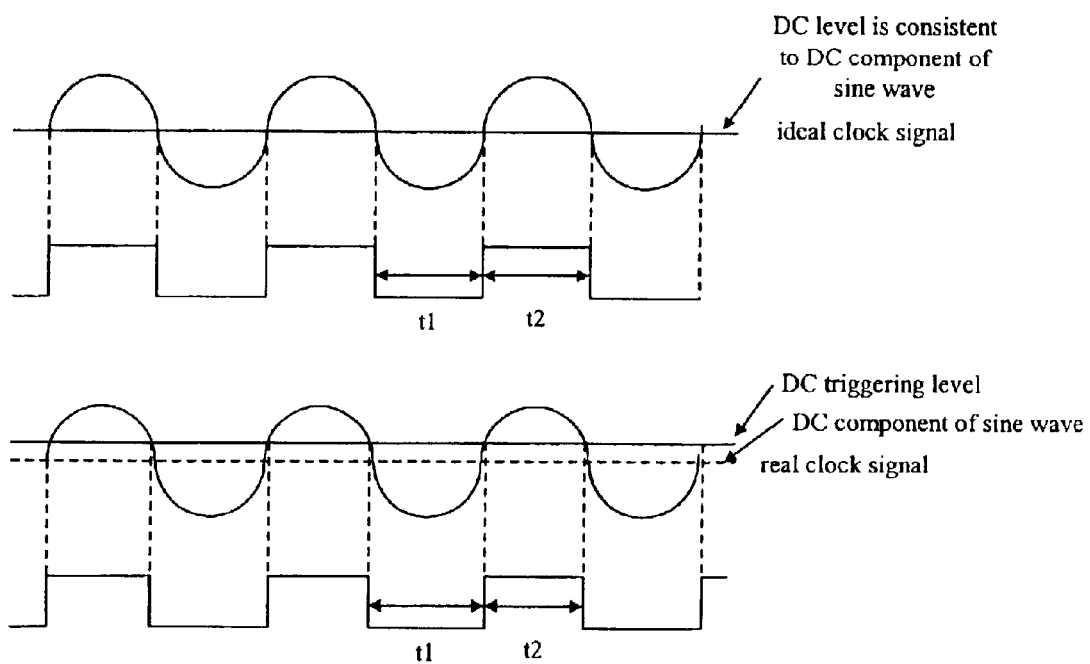
FIG. 2 is a drawing of two clock signals outputted from an ideal clock signal generator and a real clock signal generator.

When there is a clock signal input, there will be a fluctuation voltage, whose amplitude relates to duty-ratio of the clock signal, on capacitor C (C1 in FIG. 7). When duty-ratio of the clock signal is greater than a defined value, voltage on the capacitor will be increased. According to FIG. 2, at this time reference level of the comparator is increased, so the duty-ratio of the clock signal will be lowered to the defined value. In contrast, when a duty-ratio of a clock signal is less than a defined value, voltage on the capacitor is decreased and reference voltage of the comparator is decreased too. According to FIG. 2, at this time, the duty-ratio of the clock signal will be raised to the defined value. Suppose a clock signal frequency is f, then the followings can be obtained:

$$\Delta QCLK=1=I15 \times t1,$$

$$\Delta QCLK=0=I11 \times t2,$$

$$\Delta V\text{out}=(\Delta QCLK=1-\Delta QCLK=0)/C=(I15\times t1-I11\times t2)/C \quad (5)$$

$$D=t1/(t1+t2)$$

$$\Delta D=K\times\Delta V\text{out} \quad (6)$$

When I11=I15, it can be obtained from formulas (5) and (6) that:

$$\Delta D=K\times I11\times(t1-t2)/C$$

When I11=2×I15, then $$\Delta D=K\times I11\times(t1-2\times t2)/C$$

It can be seen from above formulas that when at a stable state, change of the duty-ratio is zero. Along with different proportional relationship of the I11 and I15, different duty-ratio of a clock signal can be obtained. When I11=I15, a 50% duty-ratio of the clock signal is obtained; and when I11=2× I15, it is a 66.67% duty-ratio.

For the circuit performance, the main problem is that within one clock cycle, the capacitor charging rate cannot be too fast, which relates to the clock signal frequency, the capacity volume and the charging current. It is described as follow.

Suppose that the clock signal is 10 MHz, the duty-ratio is 50%, i.e. I15=I11=I, and outer capacitor is 10 nF; the parameters are substituted to formula (5), then it is obtained that:

$$\Delta V\text{out}=(I15\times t1-I11\times t2)/C=50 \text{ ns}\times I/10 \text{ nF}.$$

When the charging current is 10 μA, then each time the charging voltage amplitude is 50 μV. In a stable state, the discharging voltage amplitude is also 50 μV. If the voltage deviation of the delay comparator is 1mV, and the reference level is 1.65V (for a 3.3V power supply), the control accuracy of the duty-ratio will not be affected because the voltage deviation is small.

Figure 8:
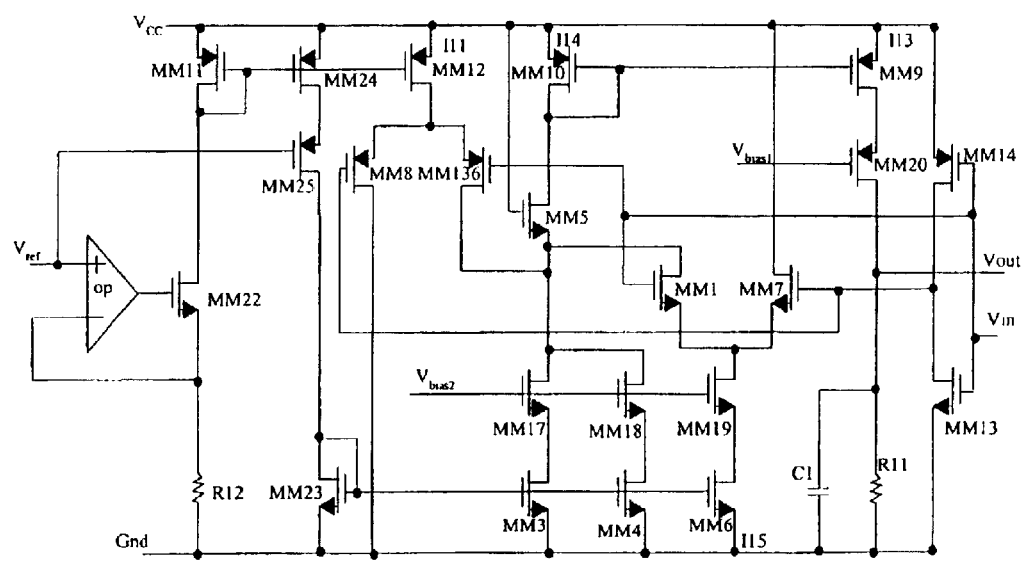
FIG. 8 is a converting circuit detail diagram which converts the duty-ratio of a clock signal to a DC level in a long delay adjusting circuit.

Reference with FIG. 8, in a long delay clock adjusting circuit, a converting circuit, in which duty-ratio of a clock signal is converted to a DC level, is further described. The converting circuit is manufactured by MOS transistor technology. In FIG. 8, Vcc is the power supply, Gnd is the ground, Vbias1 and Vbias2 are two bias voltages, Vin is an input clock signal and Vref is a reference voltage of the current source. The operational amplifier is connected as a voltage follower structure, which with transistor MM22 and resistance R12 together constitute a current source circuit. Transistor MM12 constitutes the current source I11, as mentioned above. Transistor MM3 and MM4 constitute the current source I12, Transistor MM6 constitutes the current source I15. Transistor MM10 and MM9 constitute the current mirror, which has currents I13 and I14. Transistors MM 11, MM24 and MM23 provide voltage and current bias for current sources, respectively. Transistors MM13 and MM14 constitute an inverter. Transistors MM1 and MM7 constitute the switch 1, and transistors MM8 and MM136 constitute the switch 2. Transistors MM17, MM8, MM19, MM5, MM25 and MM20 are cascode circuit, which are used to improve each circuit performance. Resistance R12 provides bias current and resistance R11 provides output DC voltage. The capacitor C 1 is a voltage to current converting device.

In addition, when the output of the converting circuit, mentioned above, is connected with input of the OTA module and the output of OTA module is connected with N terminal of the delay comparator, then an adjusting circuit is also constituted for the embodiment 2. Working procedure of this adjusting circuit is briefly analyzed as follow.

Suppose current in transistors MM3, MM4, MM6 is I, when clock signal is 1:

$$C1 dv/dt+V/R11=2\times I+I\times \text{Duty}$$

When clock signal is 0:

$$C I dv/dt+V/R11=2\times I-I\times(1-\text{Duty})$$

In a stable state, voltage on the capacitor is:

$$C I dv/dt+V/R11=2\times I+I\times(2\times\text{Duty}-1)$$

When duty-ratio of a clock signal is greater than 50%, voltage on the capacitor is increased. When duty-ratio of a clock signal is less than 50%, voltage on the capacitor is decreased. It is seen from the above formula that in a stable state, dV/dt=0 and the duty-ratio varies with voltage on the capacitor in a leaner relationship.

Figure 9:
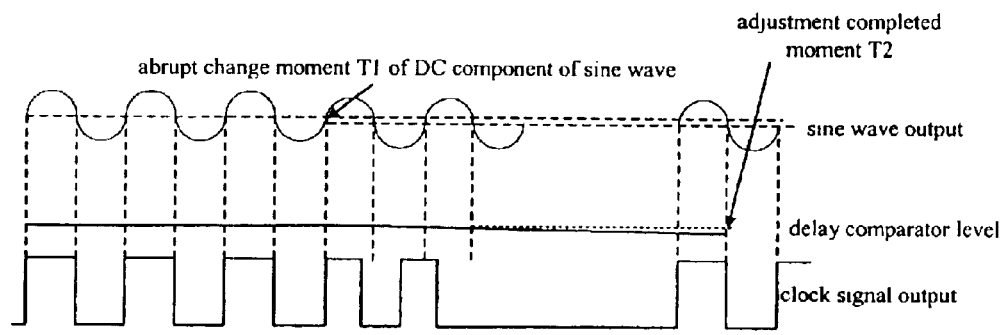
FIG. 9 is an adjusting procedure diagram of a clock signal duty-ratio in a long delay adjusting circuit.

Reference to FIG. 9, the diagram shows an adjusting procedure of a clock signal duty-ratio for a long delay clock pulse-width situation.

A clock signal duty-ratio change is caused by temperature, uneven stress distribution during packing, low-frequency noise etc. All these factors change smoothly, so a clock signal duty-ratio is also changed smoothly. In the invention circuit, this clock signal with smoothly changing duty-ratio is considered as a pulse-width modulation signal. The pulse-width modulation signal includes a low-frequency component. Through a filter, a DC level, which is proportional to a clock signal duty-ratio, can be obtained. Since a clock signal is a higher frequency, above 10 MHz in general, so a filter is designed to satisfy the above filtering requirement.

A sine wave is converted to a clock pulse signal through a delay comparator. In a conventional circuit, the DC comparative level is a constant, such as coming from a self-bring gap standard voltage, etc.; but a constant comparative level is impossible to satisfy the adjusting duty-ratio requirement. Therefore, in the invention circuit the DC comparative level is floating.

In the invention circuit, the output of a clock signal is directly used to a converting circuit, i.e. filter. In this way, influence of device dismatch, during manufacturing, on the duty-ratio of a clock signal is eliminated.

FIG. 9 shows two clock signal responses with different and constant DC components. The DC component of the sine wave in FIG. 9 changes suddenly, but it also can be used in a gradual change situation, in real.

FIG. 9 shows that the sine wave changes suddenly at T1 moment. At this moment, DC level of the delay comparator does not follow the change immediately, so duty-ratio of the clock signal is suddenly changed.

Suppose the original duty-ratio of the clock signal is:

$$\text{Duty}=t2/(t1+t2)$$

After the sudden change, duty-ratio of the clock signal is:

$$\text{Duty}'=t2'/(t1'+t2')$$

After T1 moment, DC level of the delay comparator follows DC component of the sine wave and changes gradually. At the same time, the duty-ratio at output terminal of the clock signal moves gradually forward to the preset value. At T2 moment, DC comparative level compensates completely the change of the sine wave DC component, so duty-ratio of the clock signal will recover to the preset value.

The above analysis is also suitable for DC component deviation caused by temperature, device dismatch, etc., no matter it happens at DC component of a sine wave or DC level of a delay comparator.

The duration from T1 to T2 moment can be several tens to several hundreds clock cycles, which can be adjusted according to a real situation. A longer changing period is advantage for system stability, but too long changing period will cause a low response speed and will be disadvantage for other system performance.

For a short delay clock pulse-width adjusting circuit, an converting circuit, in which the duty-ratio of a clock signal is converted to a DC level, includes two parts: detection circuit and correction circuit. The embodiments 3 and 4 give two implementation schemes and their detail description for the detection and correction circuit, respectively.

Embodiment 3

Figure 10:
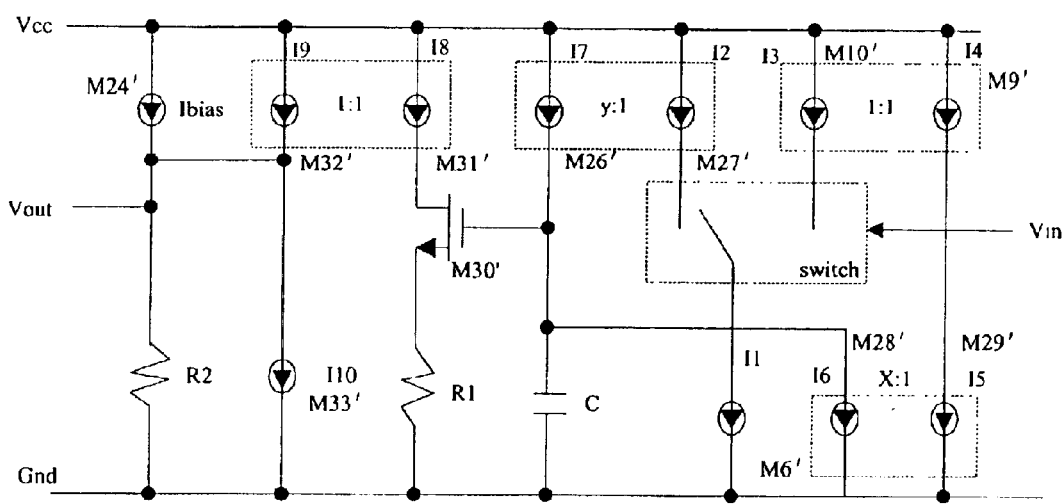
FIG. 10 is a detection and correction circuit block diagram of a clock signal duty-ratio for the embodiments (MOS).

FIG. 10 shows a schematic diagram of a detection and correction circuit for the duty-ratio of a clock signal. In FIG. 10, Vin is the clock signal input. Vout is the output, which is used as a threshold voltage of a delay comparator, of the detection and correction circuit for the duty-ratio of clock signal.

The detection circuit includes a current switch, first bias circuit, first, second and third current mirror circuits. First bias circuit M6' outputs a bias current I1. First current mirror is consisted of M27' and M26', second current mirror is consisted of M10' and M9', and third current mirror is consisted of M28' and M29'. Output currents of the first, second and third current mirror circuits are I2 and I7, I3 and I4, I5 and I6, respectively. Inputs of first and second current mirror circuit are connected to the supply, and one output of each current mirror is connected to an input of the current switch. Another output of the first current mirror is connect to the gate of the MOS transistor M30' and one end of capacitor C. Another output of the second current mirror is connected with one input end of the third current mirror. Another input end of the third current mirror is connected with one end of the capacitor C. The input of the first bias circuit is connected to the common output of the current switch. Outputs of the third current mirror, output of the first bias circuit and another end of the capacitor C are connected to the ground.

The correction circuit has a current to voltage converting circuit and a comparative circuit. Specifically, the correction circuit includes second bias circuit M24', third bias circuit M33', forth current mirror circuit, the MOS transistor M30', resistances R1 and R2, and capacitor C. Forth current mirror circuit is consisted of M31' and M32', which output currents are I18 and I19, respectively. Inputs of forth current mirror are all connected to the supply. One output of forth current mirror is connected to the drain of the MOS transistor M30', another output is connected to input of the third bias circuit M33' and the node connected to second bias circuit and resistance R2, i.e. the output of the detection and correction circuit Vout. The current to voltage converting circuit is consisted of MOS transistor M30' and capacitor C. A voltage level on the capacitor C controls the gate of M30' to decide a conduction current.

Figure 15:
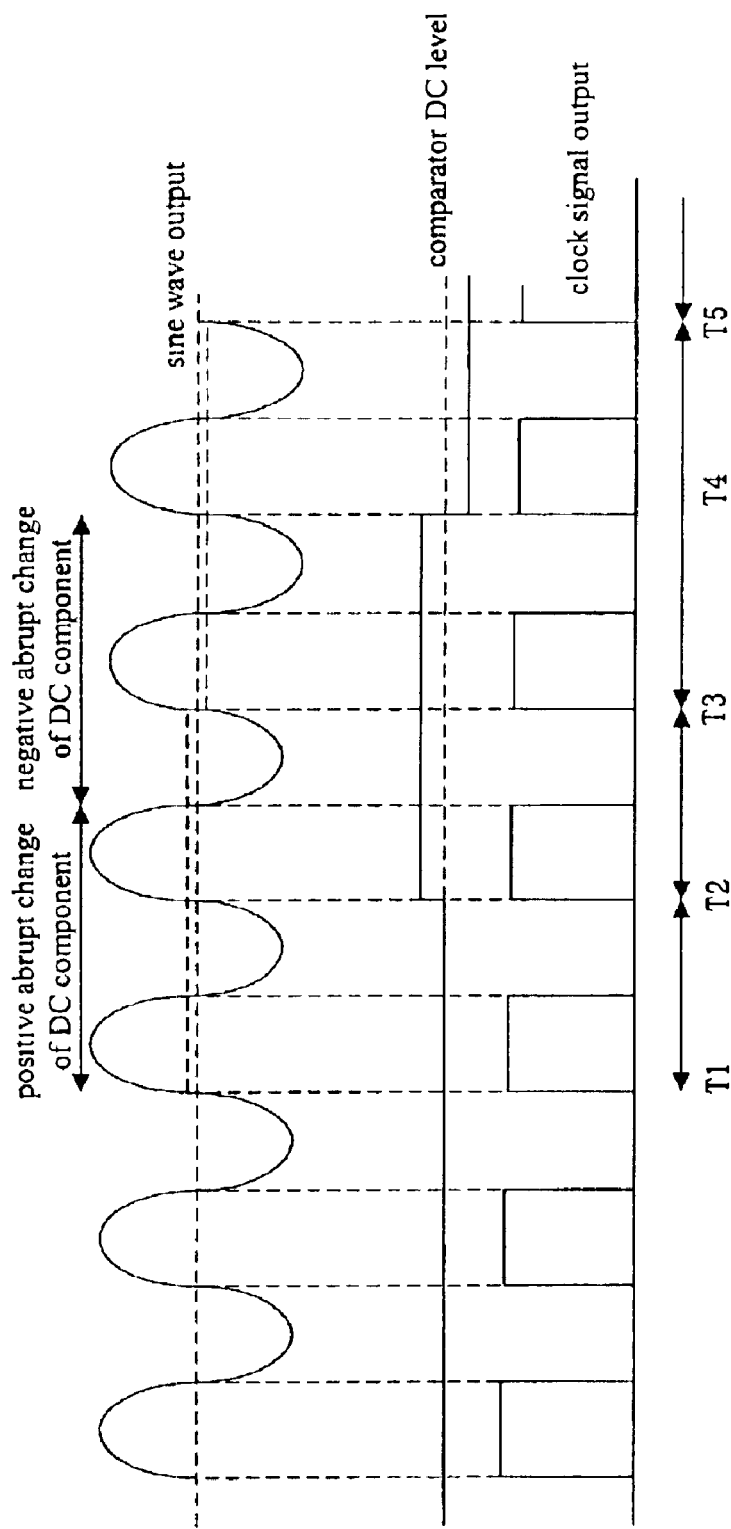
FIG. 15 is a quickly adjusting procedure diagram of a clock signal duty-ratio in a short delay adjusting circuit.

A clock signal is inputted from Vin to control the 11 direction. When Vin=1, I2=I1 and I3=0. When Vin=0, I2=0 and I3=I1. Taking x=y=1 as an example, in this case the duty-ratio of the clock signal is 50%. Suppose for some reasons, the duty-ratio of the clock signal increases then the duration of I1 connecting with I2 and the flowing of I7 is longer than the duration of I1 connecting with I3 and the flowing of I4. Wherein I1 is current of the first bias circuit. I2 and I7 are currents of the first current mirror, I3 and I4 are currents of the second current mirror. In this case during a clock cycle, charge on capacitor C charging from I7 is greater than charge discharging through I6, so voltage on the capacitor C will be raised gradually. Rising the capacitor voltage causes increasing gate voltage of transistor M30', consequently, loading voltage of resistance RI will be increased. Moreover, the channel current of transistor M30 and I8 will be increased too. Since I8 and I9 are currents of the same current mirror, I9 will be increased along with I8. Consequently, loading voltage on resistance R2 will be increased, i.e. Vout will be increased. Since the Vout is a threshold voltage of the delay comparator, as shown in FIG. 15, rising the threshold voltage will make the duty-ratio recovering. After several cycles adjusting, the duty-ratio will be adjusted to the preset value and the adjusting procedure is ended.

Setting the duty-ratio of the clock signal relates to the values of x, y of FIG. 15. In the following, the relationship between a duty-ratio and x, y value will be analyzed, it can be seen that the duty-ratio is only defined by the x and y.

Suppose duration of Vin=1 is t1 and duration of Vin=0 is t2, so the signal cycle is T=t1+t2. Voltage change on the capacitor is:

$$\Delta V = (t1 \times y - t2 \times x) \times I1/C$$

$$Vout = (Ibias - I10) \times R2 + R2 \times \Delta V/R1$$

$$\Delta Vout = R2 \times \Delta V/R1$$

$$D = t1/(t1+t2)$$

At a stable state, the output of the detection and correction circuit is a DC, i.e. the change is 0, so duty-ratio of the clock signal is a function of x and y.

$$\Delta Vout = 0 \leftarrow \rightarrow t1 \times y = t2 \times x$$

$$D = t1/(t1+t2) = x/(x+y)$$

From the above formula can be obtained that when x=y, the duty-ratio of the clock signal is 50%; when x=2y, the duty-ratio of the clock signal is 66.7%. The calculation is in an ideal state, in a real circuit because of leakage current and transistors dismatch the result is a little different.

Figure 11:
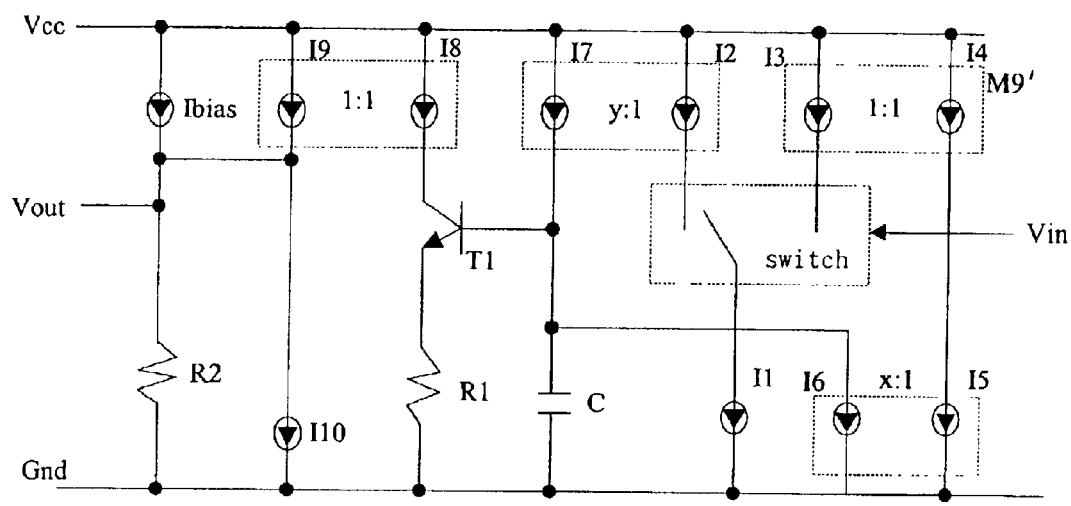
FIG. 11 is a detection and correction circuit block diagram of a clock signal duty-ratio for the embodiments (Bipolar).

FIG. 11 is a diagram of detection and correction circuit consisted of bipolar transistors for the duty-ratio of a clock signal. Comparing FIGS. 11 and 10, it can be seen that except bipolar transistor T1 replaces MOS transistor M30', other parts are all the same, so it is no need to describe again.

Since bipolar transistor is driven by a current, the error of control accuracy is larger than those using MOS transistor.

The following is a specific circuit of detection and correction circuit consisted of MOS transistors, as shown in FIG. 10, for duty-ratio of a clock signal.

Figure 12:
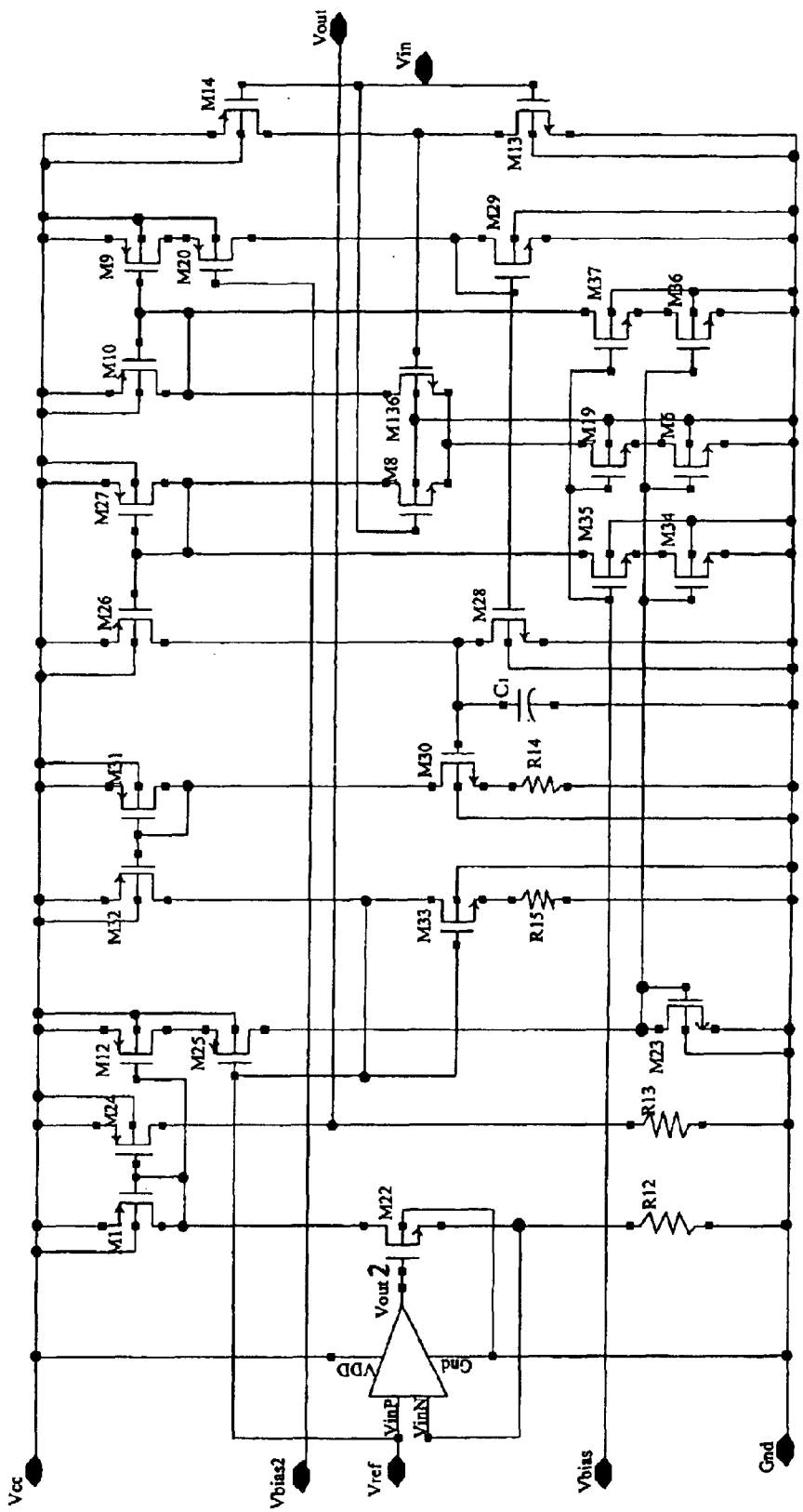
FIG. 12 is a detection and correction circuit detail diagram of a clock signal duty-ratio for the embodiments of the invention.

The detection circuit part, as shown in FIG. 12, includes an inverter, a pair of current switch, first, second and third current mirror circuits and first bias circuit. The inverter is consisted by a serial connection of PMOS transistor M14 and NMOS transistor M13. The source of transistor M13 is connected to the ground. The drain and gate of transistor M13 are connected with the drain and gate of transistor M14, respectively. The source of transistor M14 is connected to the supply Vcc. The current switch is consisted of a pair of NMOS transistors M8 and M136. The gates of transistors M8 and M136 are connected to the clock signal input Vin and the inverter output, an inverted clock signal, respectively. The sources of transistors M8 and M136 are connected to the drain of NMOS transistor M19. The drains of transistors M8 and M136 are connected to the drains of PMOS transistors M27 and M10, respectively. The first current mirror is consisted of PMOS transistors M27 and M26. The drain and gate of transistor M27 are connected with the gate of transistor M2.6. The sources of M26 and M27 are connected to the supply Vcc. The drain of M26 is connected to the drain of transistor M28 of third current mirror. In addition, the gate of transistor M28 is connected with the gate of transistor M29, and the sources of transistor M28 and transistor M29 are connected with the ground. The second current mirror is consisted of PMOS transistors M10 and M9, and the third current mirror is consisted of NMOS transistors M29 and M28. The connection of second and third current mirror is same as the first current mirror. The Vbias2 provides a gate bias voltage to M20. NMOS transistors M19 and M6 constitute the first bias circuit.

The drain of transistor M8, said above, outputs a current to the correction circuit, and the outputted current is connected to the ground through the capacitor C1, which is used as a current to voltage converter. A current mirror circuit is used to make a 1:1 conversion for the outputted current and to charge the capacity C1, when the clock signal is 1. NMOS transistors M34, M35 and M36, M37 constitute a constant current source to bias the current mirror in order to increase system response speed. The PMOS transistor M25 and NMOS transistors M19 and M37 are cascode stage, whose gate bias is provided by Vbias. The cascode circuit can effectively decrease the channel length modulation effect.

The following is a detail description of the correction circuit, which has a current to voltage conversion circuit and a comparative circuit. The forth current mirror circuit is consisted of PMOS transistors M32 and M31. The gate of M32 is connected with the gate and drain of M31. The sources of M32 and M31 are connected to the supply Vcc. The sources of NMOS transistors Ms0 and Mss are connected to resistances R14 and R15, respectively; and the other ends of R14 and R15 are connected to the ground. NMOS transistors M30 and M33 constitute the second bias circuit. The drains of transistors M33 and M30 are connected with the drains of transistors M32 and M31, respectively. The gates of M33 and M30 are connected to the gate of PMOS transistor M25 and the drain of NMOS transistor M28, respectively. Transistors M30 and M33 make voltage to current conversion and comparison. The current difference of transistors M30 and M33 on the resistance R1s forms a threshold voltage, which adjusts duty-ratio of the clock signal, of the delay comparator.

PMOS transistors M11, M24 and M12 constitute the third bias circuit, which provides bias current, their sources are all connected to the supply Vcc, and their gates and the drain of M11 are commonly connected to the drain of NMOS transistor M22. The drains of M24 and M12 are connected to resistance R13 and the source of PMOS transistor M25, respectively. The source of M25 is connected to the drain of PMOS transistor M12. The gate and drain of M25 are connected to the reference voltage Vref and the drain of NMOS transistor M23, respectively. The source of transistor M23 is connected to the ground, and the gate and drain of it are connected to the gate of transistor M6 of the detection circuit.

The current source circuit is consisted of the operational amplifier, NMOS transistor M22 and resistance R12. VinP end of the operational amplifier is connected to Vref, and output end Vout of it is connected with the gate of M22. VinN of the operational amplifier is connected with the source of M22 and one end of the resistance R12. Another end of the resistance R12 is connected to the ground. The drain of PMOS transistor M23 is connected with one end of the resistance R13, which is the DC level output Vout.

In the above circuit, the clock signal is inputted from Vin. The clock signal and the clock inverted signal control the current switch transistors M8 and M136, respectively. When the clock signal is 1, transistors M26 and M27 make the current 1:1 converting and the capacitor C1 charging. When the clock signal is 0, transistors M10, M9 and M28, M29 make the current 1:1 converting and the capacitor C1 discharging. Transistors Ms0 and Mss make voltage to current converting and comparing. The current difference of transistors Ms0 and Mss on resistance R1s forms a threshold voltage, which adjusts duty-ratio of the clock signal, for the delay comparator.

Suppose the current of transistors M6 and M19 is I, then when the clock signal is 1, the charging charge on capacitor C1 is:

$$C1 \times (dV/dt) = I \times \text{Duty}$$

When the clock signal is 0, the discharging charge of capacitor C1 is:

$$C1 \times (dV/dt) = I \times (1-\text{Duty})$$

Within a clock signal cycle, the pure charging charge is:

$$C1 \times (dVc/dt) = I \times (2 \times \text{Duty} - 1) \quad (7)$$

When duty-ratio of a clock signal is greater than 50%, voltage on the capacitor will be raised. When duty-ratio of a clock signal is less than 50%, voltage on the capacitor will be lowered. It can be seen from formula (7) that at a stable state Duty=50% and voltage on the capacitor is stable.

Suppose when the system is at a stable state and sine wave has a small change, what will happen? This is a problem about the small signal working principle of a circuit and related formulas. When a system has a small change near a stable state, voltage on the capacitor will have a small change as following:

$$C1 \times (dV/dt) = 2 \times I \times \Delta\text{Duty}$$

The small voltage change on the capacitor will lead to a threshold voltage change of the delay comparator, as shown in the following:

$$\Delta V\text{com} = (\Delta Vc/R14) \times R13$$

Suppose a duty-ratio change of the clock signal is caused by the small change of the sine wave signal. This will lead to a duty-ratio change of the clock signal as the following:

$$\Delta\text{Duty} = \Delta V/\pi \times V$$

wherein V is an amplitude of the sine wave signal.

When the system is a closed loop, any small change, whether positive or negative, of the sine wave voltage will lead to a same polarity small change at the N input end of the delay comparator. The small voltage change is:

$$\Delta V\text{com} = K \times \Delta V$$

in this formula, suppose that the system loop gain is K, which is calculated by the following formula:

$$K = \{2 \times I/(f \times C1 \times R14 \times \pi \times V) \times R13\}$$

There are three situations for the K value:

1. K=1, in this case, any small change of the duty-ratio will be completely compensated in the next clock cycle and the duty-ratio will be recovered to the setting value;

2. K<1, in this case, the duty-ratio adjustment is according to a geometrical series proportion; each adjustment accuracy is 90%, so after two clock cycles a 1% adjustment accuracy can be reached;

3. K>1, in this case, the duty-ratio is over adjusted, and the duty-ratio cannot converge at the setting value. If the duty-ratio is increased, then after a first adjustment the duty-ratio will be less than the setting value, and after a second adjustment the duty-ratio will be greater than the setting value, and so on. Therefore, the duty-ratio will swing back and forth.

Embodiment 4

Parasitic capacitance is a bottleneck of the system response speed. In embodiments, there are ways to eliminate parasitic capacitance affection in current converting paths in order to improve response speed. The circuit can be used in a 100 MHz to 400 MHz clock circuit.

Figure 13:
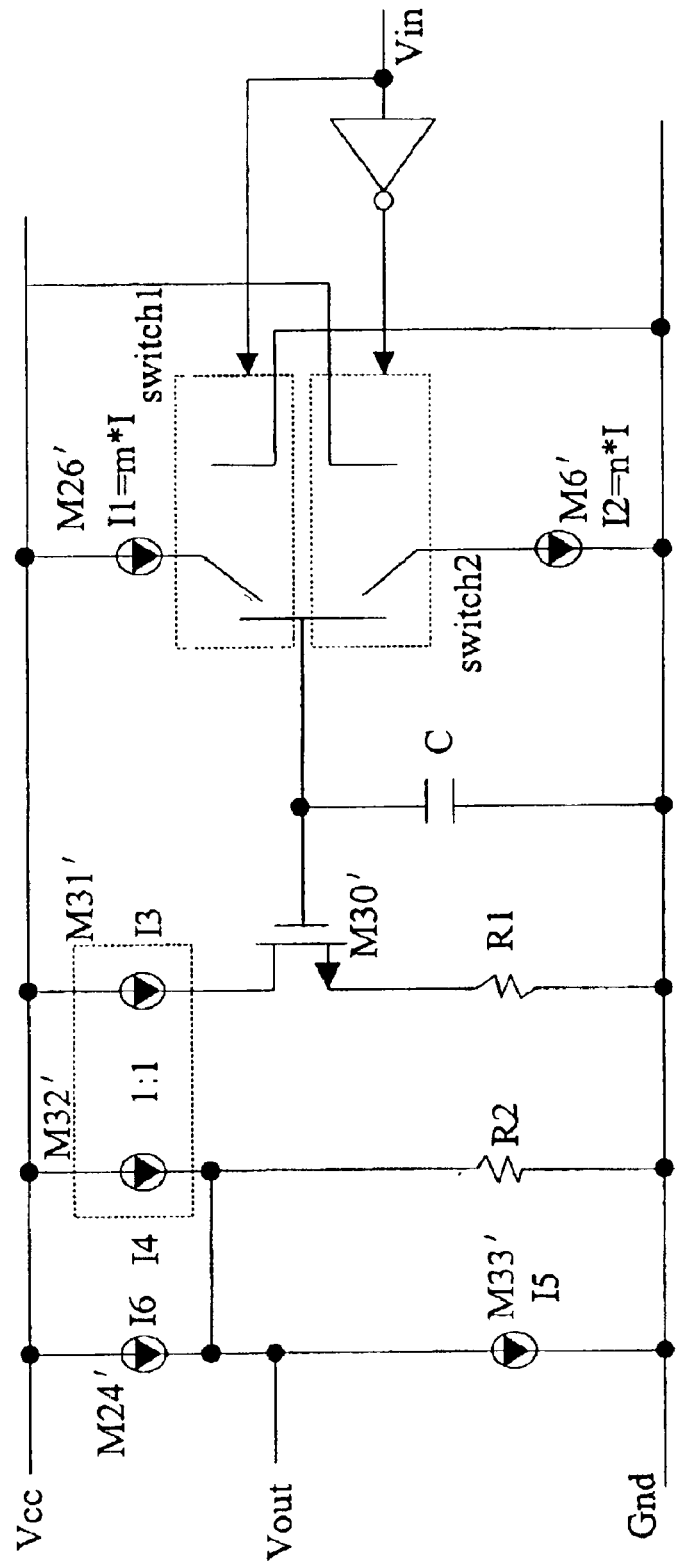
FIG. 13 is a detection and correction circuit block diagram of a clock signal duty-ratio for eliminating influence of parasitic capacitors.

FIG. 13 is a schematic diagram of a detection and correction circuit with eliminated parasitic capacitance affection for duty-ratio of the clock signal. Similar to the FIG. 10, Vin is the clock signal input, and Vout is the output, which is used as threshold voltage of the delay comparator, of the detection and correction circuit.

The detection circuit includes an inverter, current switch 1, current switch 2, first current source circuit M26' and second current source circuit M6'. Input of M26' is connected to the supply, and output of M26' is connected to current switch 1. Input of M6' is connected to the current switch 2, and output of M6' is connected to the ground. The current source circuit M26' provides a current I1=m×I, and the current source circuit M6' provides a bias current I2=n×I. One end of the current switch 1 is connected to the ground, and another end is connected to the current switch 2. Another end of the current switch 2 is connected to the supply Vcc. The clock signal input Vin and its inverted signal control current switches 1 and 2, respectively. In addition, common node of current switches 1 and 2 is connected to one end of the capacitor C, which is used in the current to voltage converting circuit.

The correction circuit is same as FIG. 10, so the description is omitted.

When Vin is a high potential, the switch 1 will turn on and the current I1 outputted from the current source M26' will charge the capacitor C, otherwise the current I1 will be connected to the ground. When Vin is a low potential, the switch 2 will turn on and the capacitor will discharge with the I2 speed through the current source M6', otherwise the current I2 will be connected to the supply Vcc.

Suppose taking m=n=1, i.e. the duty-ratio is 50%, as an example, working principle of the above circuit will be described.

Suppose for some reason, the duty-ratio of the clock signal is increased, then in each clock cycle charging charge on the capacitor C from the current source M26' will be greater than discharging charge of the capacitor C through the current source M6'. Since remaining net charge is increased, the voltage on the capacitor C will be increased. Because the capacitor C is connected with the gate of the transistor M30', so the bias voltage of transistor is raised, loading voltage on resistance R1 will be increased; and the channel current is increased, current I2 of the current source circuit M6' is increased. Since M32' and M31' constitute a current mirror, so along with the current I3 is increased the current I4 is increased too. Increasing the current I4 causes the load voltage on R2' raising, i.e. the output voltage Vout is raised. The voltage Vout is the threshold voltage of the comparator, according to FIG. 15, raising the threshold voltage of a comparator will cause the duty-ratio to be decreased. Therefore, after several clock cycles the duty-ratio is recovered to the setting value and the adjustment is ended. When the duty-ratio of the clock signal is decreased, the adjustment will be similar except signals change in an opposite polarity.

In this embodiment circuit, the duty-ratio of the clock signal is only defined by the m and n parameters. In the following, the relationship between a duty-ratio and m, n values will be analyzed. Suppose high potential duration of the clock signal is tI and low potential duration is t2, then the clock signal cycle T=tI+t2. During a clock signal cycle, charge change on the capacitor is:

$$\Delta Q = I1 \times t1 - I2 \times t2 = (m \times tI - n \times t2) \times I$$

Since $\Delta V = \Delta Q/C$ and $D = t1/(t1+t2)$, so at a stable state the duty-ratio of the clock signal is:

$$D = n/(n+m)$$

Figure 14:
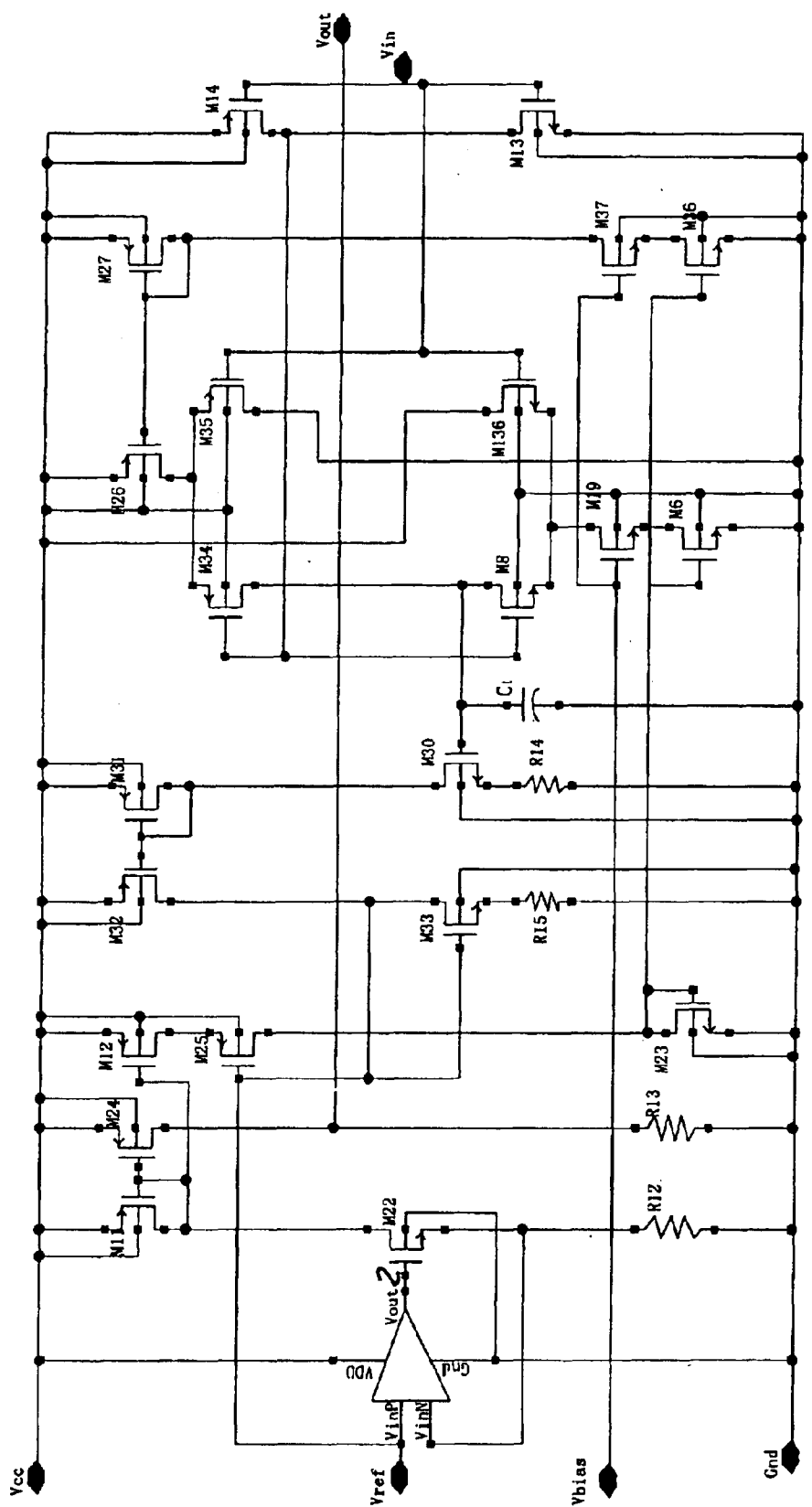
FIG. 14 is a detection and correction circuit detail diagram of a clock signal duty-ratio for the embodiments.

In FIG. 14, a specific circuit, which is consisted of MOS transistors, for the schematic diagram of FIG. 13 is shown.

This is a detection and correction circuit of the clock signal for the embodiments. Since the correction circuit is same as the correction circuit in FIG. 12 of embodiments, this part of description is omitted.

As FIG. 14 shown, the detection circuit includes an inverter, first current switch, second current switch, a current mirror circuit (corresponding to the first current source circuit in FIG. 13), and a bias circuit (corresponding to the second current source circuit in FIG. 13). The inverter is consisted of CMOS transistors M14 and M13. The source of transistor M13 is connected to the ground, its drain and gate are connected to the drain and gate of transistor M14, respectively, and the source of transistor M14 is connected to the supply Vcc. The first current switch and second current switch are consisted of a pair of NMOS transistors M8 and M136 and a pair of PMOS transistors M34 and M35, respectively. Wherein, transistors M35 and M136 constitute an OR gate, and their gates are connected to the clock signal Vin; transistors M34 and M8 constitute another OR gate, and their gates are connected to the inverted clock signal. The drains of transistors M8 and M34 are connected together, while the drain of M35 is connected to the ground and the source of M136 is connected to the supply Vcc. The sources of M8 and M136 are all connected to the drain of the PMOS transistor M19. The sources of M34 and M35 are all connected to the drain of PMOS transistor M26. The current mirror circuit is consisted of PMOS transistors M26 and M27; while the gate of the M26 is connected with the gate and drain of PMOS transistor M27, and the source of M27 is connected to the supply Vcc. The drain of M27 is connected to the drain of M37. The bias circuit is consisted of NMOS transistors M19 and M6. The gates of M19 and M37 are all connected to the bias voltage Vbias, and their sources are connected to the drains of NMOS transistors M6 and M36, respectively. The gate of M6 and the gate of M23 are all connected to the drain of NMOS transistor M23 of the correction circuit part. In addition, the drain of transistor M8 charges the capacitor CI of the correction circuit part, and through C1 to connect to the ground.

The correction circuit is used to make a current 1:1 conversion and a charging of the capacitor CI. Transistors M8 and M136 are the current switch when the clock signal is 0, and transistors M34 and M35 are the current switch when the clock signal is 1. The bias circuit, consisted of transistors M34, M35, and M36, M37, provides a bias to the current mirror in order to raise the system response speed. The PMOS transistor M25, NMOS transistors M19 and M37 are all cascode circuit, which can effectively decrease channel length modulation effect.

The duty-ratio of a clock signal is changed by temperature, unevenly distributed strength during packing and low frequency noise etc. These causes change slowly, so the duty-ratio of a clock signal is slowly changed too. In the improved circuit, a clock signal with slowly changing duty-ratio is concerned as a pulse width modulation (PWM) signal. In a worse application environment, such as serious electromagnetic interference, propagation media characteristic changing suddenly etc., the duty-ratio of a clock signal can be rapidly changed.

In the invention circuit, the duty-ratio of a clock signal can be set with a defined value, any deviation, including slowly changing or rapidly changing, will be detected and corrected within one to two clock cycles. In this invention, there are two types of the detection circuit, as shown in embodiments 3 and 4. In embodiments, correcting is made by using equity constant-current source method.

In the invention circuit, a clock signal is directly used to the detection circuit in order to avoid influence of device dismatch caused by integrated circuit manufacturing.

FIG. 15 shows the clock signal response when two different DC component values of the clock signal happened. The DC component is suddenly changed in FIG. 15, but the circuit is also suitable for a slowly changing situation.

In FIG. 15, DC component of the clock signal is suddenly changed at T1 moment, a positive change. At this moment, as the DC level of the delay comparator does not change immediately, the duty-ratio of the clock signal will be suddenly changed, but it is only lasted one clock cycle. At T2 moment, as the threshold voltage has compensated the positive change of sine wave DC component, duty-ratio of the clock signal will be recovered to the set value, after only one clock cycle.

After threshold voltage of the delay comparator has been raised, if the clock signal DC component is unchanged, then the threshold voltage of the delay comparator will be unchanged, as shown in the duration of T2 to T3 in FIG. 15.

In FIG. 15, at T3 moment the DC component of the clock signal suddenly has a negative change. Since the DC level of the delay comparator cannot follow the change immediately, at this moment the duty-ratio of the clock signal will be suddenly changed. Because at this time the DC component of the clock signal is changed from a positive deviation to a negative deviation, the adjustment procedure will possibly last one to two clock cycles (depending on the possible maximum adjusting step of the detection and correction circuit). FIG. 15 shows a two clock cycles situation, T3 to T4 cycle and T4 to T5 cycle.

At T5 moment, the DC level change of the delay comparator has compensated the DC component change of the sine wave, so the duty-ratio of the clock signal recovers to the set value. After that, if the DC component of the negative sine wave is unchanged, then the DC level of the delay comparator will keep unchanged too, as shown after the T5 moment in FIG. 15.

The above description of the embodiments three and four is at the situation that the adjustment is for a sudden change of the duty-ratio of the clock signal. Nevertheless, the circuits can also make an adjustment and compensation for the slow change of the clock signal duty-ratio.

In the embodiments 3 and 4, there is no low pass filter, so the circuit performance is only related to the devices performance in the key path of the detection and adjustment circuit.

In the embodiments 3 and 4 circuits, an error between the duty-ratio and an expected value is attenuated according to the exponential law. Suppose each time the adjustment amplitude is 80%, then after N times adjustment, the error between the real duty-ratio and a set value is $(1-80\%)^N$. If the adjusting error is set as 1% and each time the adjusting amplitude is 80%, then only three clock cycles the adjustment will be performed.

The above analysis is also suitable for the situation that a DC component deviation is caused by temperature and devices dismatch etc., no matter the DC deviation is happened at the sine wave side or the delay comparator side.

The embodiments three and four circuits can be also manufactured with CMOS technology. Therefore, the duty-ratio adjustment problem of a clock signal in a digital analog mixed circuit also can be solved.

In summary, the duty-ratio adjustment circuit of the invention can be used in almost all clock circuits. In a modern communication system, since the PLL (phase locked loop) and crystal oscillator are widely used, the invention circuit will be spread used, including digital communication system, multimedia system etc. Since the invention circuit has characteristics of quick response speed, powerful anti-electromagnetic interference etc., it also can be used in electric countermeasure equipment, radar etc.

All the above mention is only the invention embodiments that do not be used to limit the protection scope of the invention.

What is claimed is:

1. A delay clock pulse-width adjusting circuit, comprising:
    a power supply;
    a delay comparator connected to the power supply, said delay comparator having one input terminal arranged to input a sine wave signal and another input terminal-arranged to input a compare voltage, and an output terminal arranged to output a clock signal with a defined duty-ratio; and
    a converting circuit connected to the power supply and arranged to convert the duty-ratio of the clock signal to a voltage level, the converting circuit having an input terminal connected to the output terminal of the delay comparator, which output terminal is connected to the another input terminal of the delay comparator.

2. The delay clock pulse-width adjusting circuit according to claim 1, wherein the converting circuit mainly comprises a Pulse-Width Modulation (PWM) filter module which converts the duty-ratio of the clock signal to a voltage level.

3. The delay clock pulse-width adjusting circuit according to claim 1, wherein the converting circuit mainly comprises a pulse-width modulator (PWM) filter module, which converts the duty-ratio of the clock signal to a voltage level, and a low pass filter circuit, which filters the voltage level outputted from the PWM filter module and outputs the filtered voltage level to the delay comparator another input terminal.

4. The delay clock pulse-width adjusting circuit according to claim 3, wherein the low pass filter is a transconductance operational amplifier.

5. The delay clock pulse-width adjusting circuit according to claim 2 or 3, wherein the PWM filter further comprises:
    an inverter, inverting the input clock signal to output an inverted clock signal;
    a first switch controlled by the inverted clock signal;
    a second switch controlled by the clock signal;
    a first current source, connected to the power supply with one end and connected to the first switch with another end;

a second current source, connected to the power ground with one end and connected to a node A with another end;

a third current source, connected to the power ground with one end and connected to the second switch with another end;

a first current mirror, connected to the second switch with one end and connected to the power supply with another end;

a second current mirror, connected to the power supply with one end and connected to the output terminal with another end, and a current to voltage converter, connected to the power ground with one end and connected to the output terminal with another end.

6. The delay clock pulse-width adjusting circuit according to claim 5, wherein the first switch is an OR gate consisted of a pair of PMOS transistors and the second switch is an OR gate consisted of a pair of NMOS transistors.

7. The delay clock pulse-width adjusting circuit according to claim 5, wherein the current mirror is consisted of two MOS transistors with the connections as follows: the drain and gate of one MOS transistor is connected with the gate of another MOS transistor, the sources of the two MOS transistors are connected with the supply, and the drain of another MOS transistor is the output.

8. The delay clock pulse-width adjusting circuit according to claim 5, wherein the current to voltage converter is a capacitor.

9. The delay clock pulse-width adjusting circuit according to claim 1, wherein the converting circuit at least comprises:

a detection circuit used to detect the input clock signal, which is the output of the delay comparator, to the floating signal and to output a voltage difference according to the floating signal; and a correction circuit used to correct the threshold voltage inputted to the delay comparator.

10. The delay clock pulse-width adjusting circuit according to claim 9, wherein the detection circuit further comprises:

an inverter, inverting the input clock signal to output an inverted clock signal;

a current switch, switching to one input or another input according to the clock signal and inverted clock signal;

a first current mirror circuit, connected to one input of the current switch with its one output and charging the capacitor of the correction circuit when the clock signal is a high level;

a second current mirror circuit, connected to another input of the current switch with its one output; and a third current mirror circuit, connected to another output of second current mirror circuit with one input and discharging the capacitor of the correction circuit when the clock signal is a low level.

11. The delay clock pulse-width adjusting circuit according to claim 10, wherein the detection circuit further comprises a current source used to provide a bias current to the current switch.

12. The delay clock pulse-width adjusting circuit according to claim 9, wherein the detection circuit at least comprises:

an inverter, inverting an input clock signal to output an inverted clock signal;

a first and a second current switches, connected serially with each other and switching on according to the clock signal and inverted clock signal;

a first current source circuit, connected to the supply with one end and connected to the first current switch with another end, also charging the capacitor of the correction circuit when the clock signal is a high level; and a second current source circuit, connected to the second current switch with one end and connected to the ground with another end, also discharging the capacitor of the correction circuit when the clock signal is a low level.

13. The delay clock pulse-width adjusting circuit according to claim 10, wherein the current switch is an OR gate consisted of two MOS transistors.

14. The delay clock pulse-width adjusting circuit according to claim 12, wherein the current switch is an OR gate consisted of two MOS transistors.

15. The delay clock pulse-width adjusting circuit according to claim 10, wherein the current mirror circuit is consisted of two MOS transistors with the connections as follows: the drain and gate of one MOS transistor is connected with the gate of another MOS transistor, the sources of the two MOS transistors are connected with the supply, and the drain of another MOS transistor is the output.

16. The delay clock pulse-width adjusting circuit according to claim 12, wherein the current mirror circuit is consisted of two MOS transistors with the connections as follows: the drain and gate of one MOS transistors are connected with the supply, and the drain of another MOS transistor is the output.

17. The delay clock pulse-width adjusting circuit according to claim 9, wherein the correction circuit comprises a current to voltage converting circuit and a comparative circuit.

18. The delay clock pulse-width adjusting circuit according to claim 17, wherein the correction circuit is a current source circuit consisted of an operational amplifier, a NMOS transistor and a resistance.

19. The delay clock pulse-width adjusting circuit according to claim 17, wherein the current to voltage circuit comprises a MOS transistor and a capacitor.

20. A long delay clock pulse-width adjusting circuit for intermediate or high frequency comprises:

a plurality of power supplies;

a delay comparator connected to said power supplies, said delay comparator having one input terminal arranged to input a sine wave signal and another input terminal arranged to input a compare voltage, and an output terminal arranged to output a clock signal with a defined duty-ratio; and a PWM filter module connected to at least one of said power supplies and arranged to convert the duty-ratio of the clock signal to a voltage level, the converting circuit having an input terminal connected to the output terminal of the delay comparator, which output terminal is connected to the another input terminal of the delay comparator.

21. The long delay clock pulse-width adjusting circuit according to claim 20, wherein the PWM filter module comprises:

an inverter, inverting the input clock signal to output an inverted clock signal;

a first switch controlled by the inverted clock signal;

a second switch controlled by the clock signal;

a first current source, connected to the supply with one end and connected to the first switch with another end;

a second current source, connected to the ground with one end and connected to a node A with another end;

a third current source, connected to the ground with one end and connected to the second switch with another end;

a first current mirror, connected to the second switch with one end and connected to the power supply with another end;

a second current mirror, connected to the supply with one end and connected to the output terminal with another end, and a current to voltage converter, connected to the ground with one end and connected to the output terminal with another end.

22. The long delay clock pulse-width adjusting circuit according to claim 21, wherein the first switch is an OR gate consisted of a pair of PMOS transistors and the second switch is an OR gate consisted of a pair of NMOS transistors.

23. The long delay clock pulse-width adjusting circuit according to claim 21, wherein the current mirror is consisted of two MOS transistors with the connections as follows: the drain and gate of one MOS transistor is connected with the gate of another MOS transistor, the sources of the two MOS transistors are connected with the supply, and the drain of another MOS transistor is the output.

24. The long delay clock pulse-width adjusting circuit according to claim 21, wherein the current to voltage converter is a capacitor.

25. A long delay clock pulse-width adjusting circuit for intermediate or high frequency comprises:

a plurality of power supplies;

a delay comparator connected to said power supplies, said delay comparator having one input terminal arranged to input a sine wave signal and another input terminal arranged to input a compare voltage, and an output terminal arranged to output a clock signal with a defined duty-ratio; and a PWM filter module connected to at least one of said power supplies and arranged to convert the duty-ratio of the clock signal to a voltage level, the converting circuit having an input terminal connected to the output terminal of the delay comparator, and a low pass filter circuit filtering the voltage level outputted by the PWM filter module, which input terminal is connected to the output terminal of the PWM filter module and output terminal is connected to the another input terminal of the delay comparator.

26. The long delay clock pulse-width adjusting circuit according to claim 25, wherein the low pass filter circuit is a transconductance operational amplifier.

27. The long delay clock pulse-width adjusting circuit according to claim 25, wherein the PWM filter further comprises:

an inverter, inverting the input clock signal to output an inverted clock signal;

a first switch controlled by the inverted clock signal;

a second switch controlled by the clock signal;

a first current source, connected to the supply with one end and connected to the first switch with another end;

a second current source, connected to the ground with one end and connected to a node A with another end;

a third current source, connected to the ground with one end and connected to the second switch with another end;

a first current mirror, connected to the second switch with one end and connected to the power supply with another end;

a second current mirror, connected to the supply with one end and connected to the output terminal with another end, and a current to voltage converter, connected to the power ground with one end and connected to the output terminal with another end.

28. The long delay clock pulse-width adjusting circuit according to claim 27, wherein the first switch is an OR gate consisted of a pair of PMOS transistors and the second switch is an OR gate consisted of a pair of NMOS transistors.

29. The long delay clock pulse-width adjusting circuit according to claim 27, wherein the current mirror is consisted of two MOS transistors with the connections as follows: the drain and gate of one MOS transistor is connected with the gate of another MOS transistor, the sources of the two MOS transistors are connected with the supply, and the drain of another MOS transistor is the output.

30. The long delay clock pulse-width adjusting circuit according to claim 27, wherein the current to voltage converter is a capacitor.

* * * * *